United States Patent
Tsujimura et al.

(10) Patent No.: US 7,173,278 B2
(45) Date of Patent: Feb. 6, 2007

(54) THIN-FILM TRANSISTOR IN WHICH FLUCTUATIONS IN CURRENT FLOWING THERETHROUGH ARE SUPPRESSED, AND IMAGE DISPLAY APPARATUS

(75) Inventors: Takatoshi Tsujimura, Kanagawa (JP); Shinya Ono, Kanagawa (JP); Mitsuo Morooka, Kanagawa (JP); Koichi Miwa, Kanagawa (JP)

(73) Assignee: Kyocera Corporation, Kyoto (JP)

( * ) Notice: Subject to any disclaimer, the term of this patent is extended or adjusted under 35 U.S.C. 154(b) by 10 days.

(21) Appl. No.: 10/843,337

(22) Filed: May 12, 2004

(65) Prior Publication Data

US 2004/0262607 A1  Dec. 30, 2004

(30) Foreign Application Priority Data

May 16, 2003  (JP)  ............................. 2003-139476

(51) Int. Cl.
*H01L 29/04* (2006.01)
*H01L 31/20* (2006.01)

(52) U.S. Cl. ........................... 257/59; 257/59; 257/61; 257/57; 345/204

(58) Field of Classification Search ........ 257/E51.001, 257/E51.002, E51.018, 59, 103, 72, 57, 61; 345/204

See application file for complete search history.

(56) References Cited

U.S. PATENT DOCUMENTS

| 5,656,824 A | * | 8/1997 | den Boer et al. | ............. 257/59 |
| 6,350,995 B1 | | 2/2002 | Sung et al. | |
| 2003/0094616 A1 | * | 5/2003 | Andry et al. | ................. 257/72 |

FOREIGN PATENT DOCUMENTS

| JP | 8-234683 A | 9/1996 |
| JP | 10333641 | * 12/1998 |

* cited by examiner

*Primary Examiner*—Zandra V. Smith
*Assistant Examiner*—Tsz Chiu
(74) *Attorney, Agent, or Firm*—Birch, Stewart, Kolasch & Birch, LLP

(57) ABSTRACT

A thin film transistor according to the present invention includes a gate electrode, a semiconductor layer having a channel forming region arranged on the gate electrode and an impurity region arranged on a part of the channel forming region, source and drain electrodes electrically connected to the impurity region, and a gate insulating film that electrically insulates the gate electrode and the semiconductor layer, wherein the distance between the upper end of the gate electrode and the upper end of the impurity region is larger than the distance between the upper end of the gate electrode and the upper end of the channel forming region.

8 Claims, 10 Drawing Sheets

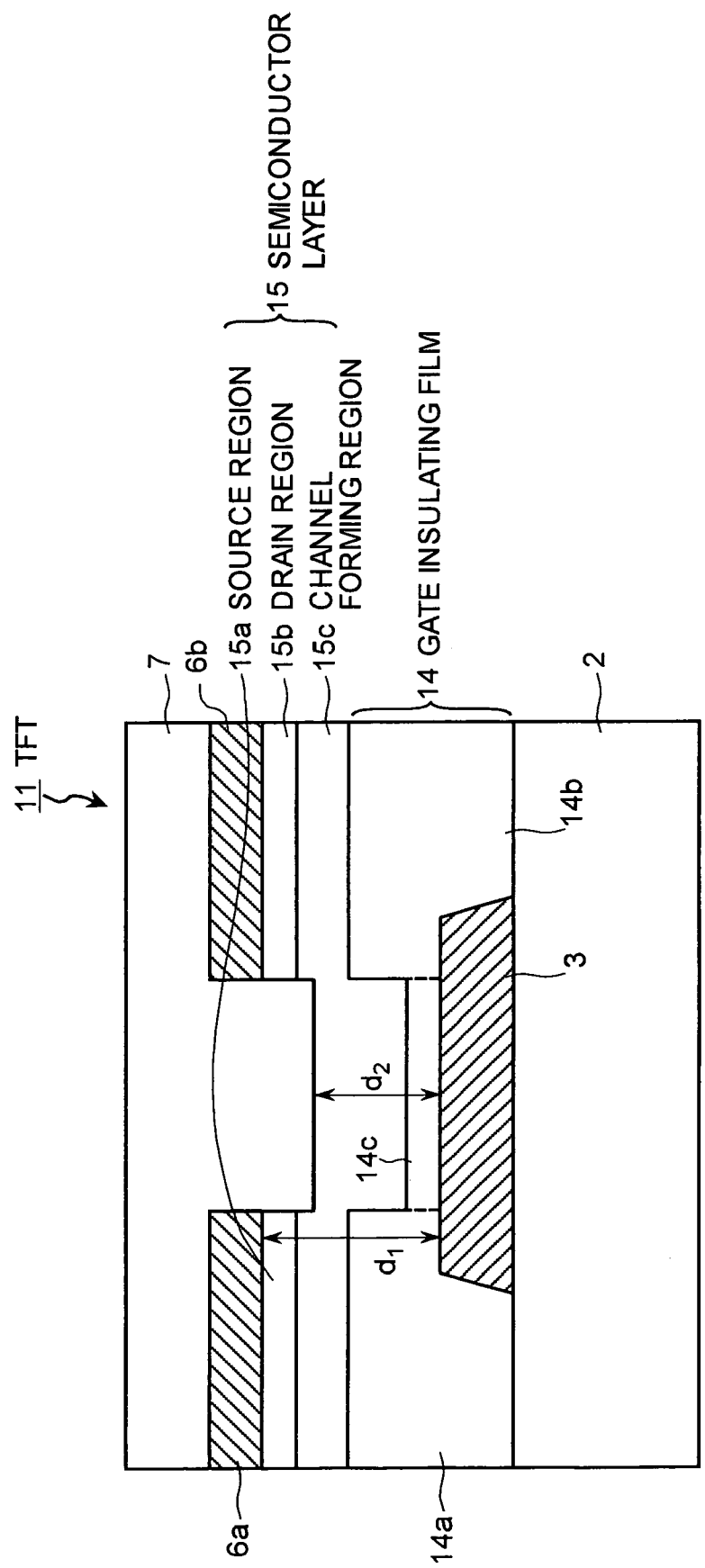

THIN-FILM TRANSISTOR IN WHICH FLUCTUATIONS IN CURRENT FLOWING THERETHROUGH ARE SUPPRESSED, AND IMAGE DISPLAY APPARATUS

CROSS-REFERENCE TO RELATED APPLICATIONS

This Non-provisional application claims priority under 35 U.S.C. § 119(a) on Patent Application No(s). 2003-139476 filed in Japan on May 16, 2003, the entire contents of which are hereby incorporated by reference.

BACKGROUND OF THE INVENTION

1) Field of the Invention

The present invention relates to a thin film transistor used for a pixel circuit having a current-controlled light emitting element, and an image display apparatus.

2) Description of the Related Art

An organic electro-luminescence (EL) display apparatus using an organic light-emitting-diode (LED) that emits light autonomously is getting an attention as a next generation image display apparatus, because it does not require a back light that is necessary in a liquid crystal display (LCD) apparatus, which makes it most suitable for reducing thickness of the apparatus, and does not have any limitation in the angle of visibility. Unlike the liquid crystal display apparatus in which a liquid crystal cell is controlled by a voltage, the organic LED used for the organic EL display apparatus has a mechanism that the brightness of each light emitting element is controlled by a current.

In the organic EL display apparatus, a simple (passive) matrix type and an active matrix type can be employed as a drive system. The former has a simple configuration, but has a problem of realization of a large and high definition display. Therefore, a research and development is focused on an active-matrix-type image display apparatus that controls current flowing in a light emitting element in a pixel by a driver element such as a thin film transistor (TFT) provided in the pixel.

The pixel circuit included in the active-matrix-type image display apparatus includes a driver element that is serially connected to an organic light emitting diode (LED), and controls light emission of the organic LED and the brightness of the light emission, and a switching element that is connected to the driver element and controls the operation for transmitting voltage supplied from a data line to the inside of the pixel circuit (hereinafter, "write") (see for example, Japanese Patent Application Laid-Open No. H8-234683 (page 10 and FIG. 1)). The voltage written into the pixel under the control of the switching element is applied to a gate electrode of the driver element, and the driver element controls the current flowing into the organic LED, regulating the current flowing through the driver element by the voltage applied to the gate electrode.

However, when the TFT using amorphous silicon for a semiconductor layer is operated for long time, the threshold voltage fluctuates, as shown in FIG. 10, and hence the current flowing through the TFT also fluctuates, causing a problem of degradation of image quality. FIG. 11 is a graph of voltage-current characteristic of a TFT with the current started to flow and the TFT with the current flowed for long time. As shown by curve $I_3$, the threshold voltage of the initial TFT when the current starts to flow is $V_{th}$. However, the threshold voltage of the TFT in which the current has flowed for long time changes, as shown by curve $I_4$, from $V_{th}$ to $V_{th}'$ in the positive direction. At this time, even when the gate-source voltage has the same value $V_D$, the drain current flowing through the TFT changes from $I_{d1}$ to $I_{d2}$ ($<I_{d1}$). When the threshold voltage of the TFT used for the driver element fluctuates, even when the voltage supplied into the pixel circuit is the same, the current flowing through the driver element fluctuates, and hence the current flowing through the organic LED also fluctuates. Therefore, the emission brightness of the organic LED becomes nonuniform, thereby deteriorating the image quality of the image display apparatus.

SUMMARY OF THE INVENTION

The thin film transistor according to one aspect of the present invention includes a gate electrode arranged on a substrate; a semiconductor layer including a channel forming region arranged on the gate electrode, and an impurity region arranged on a part of the channel forming region; a source electrode and a drain electrode electrically connected to the impurity region and arranged to be separated from each other; and a gate insulating film that is provided between the gate electrode and the semiconductor layer, and electrically insulates the gate electrode and the semiconductor layer. A distance between an upper end of the gate electrode and an upper end of the impurity region is longer than a distance between an upper end of the gate electrode and an upper end of the channel forming region.

The active-matrix-type image display apparatus according to another aspect of the present invention includes a light emitting element that emits light of brightness corresponding to a current applied; a driver element that is connected to the light emitting element in series to control light emission of the light emitting element, including a thin film transistor; and a switching element that controls a voltage to a gate electrode of the thin film transistor. The thin film transistor includes the gate electrode arranged on a substrate; a semiconductor layer including a channel forming region arranged on the gate electrode and an impurity region arranged on a part of the channel forming region; a source electrode and a drain electrode electrically connected to the impurity region and arranged to be separated from each other; and a gate insulating film that is provided between the gate electrode and the semiconductor layer, and electrically insulates the gate electrode and the semiconductor layer. A distance between an upper end of the gate electrode and an upper end of the impurity region is longer than a distance between an upper end of the gate electrode and an upper end of the channel forming region.

The active matrix type image display apparatus according to still another aspect of the present invention includes a light emitting element that emits light of brightness corresponding to a current applied; a driver element that is connected to the light emitting element in series to control light emission of the light emitting element; a current determining element that controls a current flowing through the driver element by passing the current corresponding to an applied voltage, including a thin film transistor; and a capacitor that converts the current flowing through the current determining element into voltage and holds the voltage as gate-source voltage of the driver element. The thin film transistor includes the gate electrode arranged on a substrate; a semiconductor layer including a channel forming region arranged on the gate electrode and an impurity region arranged on a part of the channel forming region; a source electrode and a drain electrode electrically connected to the impurity region and arranged to be separated from each other; and a gate insulating film that is provided between the gate electrode and the semiconductor layer, and electrically insulates the gate electrode and the semiconductor layer. A distance between an upper end of the gate electrode and an upper end of the impurity region is longer than a distance between an upper end of the gate electrode and an upper end of the channel forming region.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 5 is another example of cross section of the TFT according to the first embodiment;

DETAILED DESCRIPTION

Figure 1:
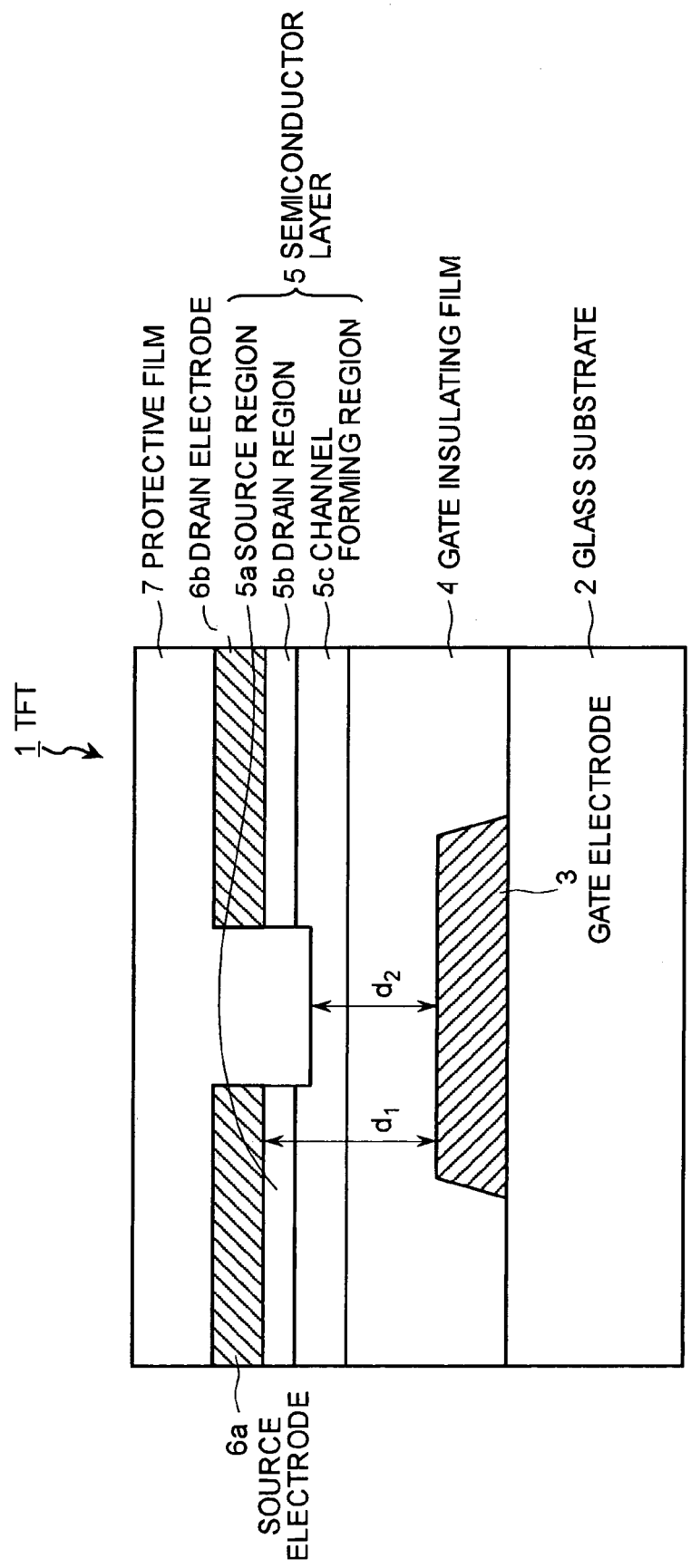
FIG. 1 is a cross section of a TFT according to a first embodiment of the present invention.

Exemplary embodiments of a thin film transistor in which fluctuations in current therethrough are suppressed, and image display apparatus according to the present invention will be explained in detail with reference to the accompanying drawings. The present invention is not limited by the embodiments.

Regarding explanation of the drawings, like reference numerals designate like parts. The drawings are schematic, and it should be noted that the relation between the thickness and the width in the respective layers and the ratio of respective layers are different from actual products.

The TFT according to a first embodiment of the present invention realizes suppression of fluctuations in threshold voltage, by increasing the distance between the upper end of a gate electrode and the upper end of an impurity region than the distance between the upper end of the gate electrode and the upper end of a channel forming region, to decrease the strength of an electric field generated between a source electrode and the gate electrode.

FIG. 1 is a cross section of the TFT according to the first embodiment. The TFT 1 includes, on a glass substrate 2, a gate electrode 3, and a gate insulating film 4 laminated on the gate electrode 3 so as to cover it. On the gate insulating film 4, the TFT 1 includes a channel forming region 5c, and a semiconductor layer 5 having a source region 5a and a drain region 5a, being an impurity region arranged on a partial region of the channel forming region 5c and added with impurities. The TFT 1 further includes a source electrode 6a and a drain electrode 6b, respectively, on the source region 5a and the drain region 5b, arranged so as to be electrically connected to the source region 5a and the drain region 5b, respectively, and be away from each other. Further, the TFT 1 has a protective layer 7 arranged so as to cover the source electrode 6a, the drain electrode 6b, and the channel forming region 5c. Here, the film thickness of the semiconductor layer 5 in the region where the source region 5a and the drain region 5b are arranged is thicker than that of the semiconductor layer 5 in the region above the gate electrode 3. For the brevity of explanation, an electrode applied with a voltage higher than that applied to the other electrode is designated as the drain electrode 6b, and the other electrode is designated as the source electrode 6a.

The gate electrode 3 is formed of a conductive material such as a metal film such as Chromium (Cr), Aluminum (Al) or the like, alloys thereof, or a transparent material such as Indium Tin Oxide (ITO). The gate electrode 3 may have a rectangular shape, other than the trapezoidal shape in cross section, as shown in FIG. 1.

The gate insulating film 4 is provided between the gate electrode 3 and the semiconductor layer 5, for electrically insulating the gate electrode 3 and the semiconductor layer 5, and is formed of, for example, a transparent insulating film such as silicon nitride ($SiN_x$) or silicon oxide ($SiO_2$), or a multi-layer film obtained by laminating these films.

The semiconductor layer 5 having the source region 5a, the channel forming region 5c, and the drain region 5b is formed of amorphous silicon. The channel forming region 5c is formed of a p-type semiconductor, in the case of an n-channel TFT, or an n-type semiconductor, in the case of a p-channel TFT, but since the TFT 1 is formed of amorphous silicon, doping with impurities may be omitted. The source region 5a and the drain region 5b are formed of a semiconductor layer doped with high-density impurities, as compared with the channel forming region 5c. In the case of the n-channel TFT, n-type impurities such as phosphorus (P) or arsenic (As) are doped, and in the case of the p-channel TFT, p-type impurities such as boron (B) are doped. The TFT 1 according to the first embodiment will be explained as the n-channel TFT, but the present invention is not limited to the n-channel TFT, and can be applied to the p-channel TFT.

The film thickness of the semiconductor layer 5 in the region where the source region 5a and the drain region 5b are arranged is thicker than that of the semiconductor layer 5 in the region above the gate electrode 3. Therefore, in the TFT 1, the distance $d_1$ between the upper end of the source region 5a and the upper end of the gate electrode 3 is larger than the distance $d_2$ between the upper end of the channel forming region 5c and the upper end of the gate electrode 3.

The source electrode 6a and the drain electrode 6b are formed of a conductive material similar to that of the gate electrode 3. The protective film 7 is formed by using a silicon nitride film. The protective film 7 is laminated for maintaining the stable operation of the TFT in the image display area.

An n-channel is formed in the channel forming region 5c, by applying a voltage higher than the threshold voltage to the gate electrode 3. The n-channel conducts electricity between the source region 5a including the n-type impurities and the drain region 5b. By applying a predetermined voltage to the drain electrode 6b, the current flows between the source region 5a and the drain region 5b via the n-channel. The current flowing between the source region 5a and the drain region 5b is a drain current. The drain current is taken in the source electrode 6a or the drain electrode 6b, and supplied to the outside via a wiring layer connected to the source electrode 6a and the drain electrode 6b.

The TFT 1 according to the first embodiment can reduce fluctuations in the threshold voltage, as compared with the TFT having the conventional configuration, even when the current has flowed for long time.

Figure 2:
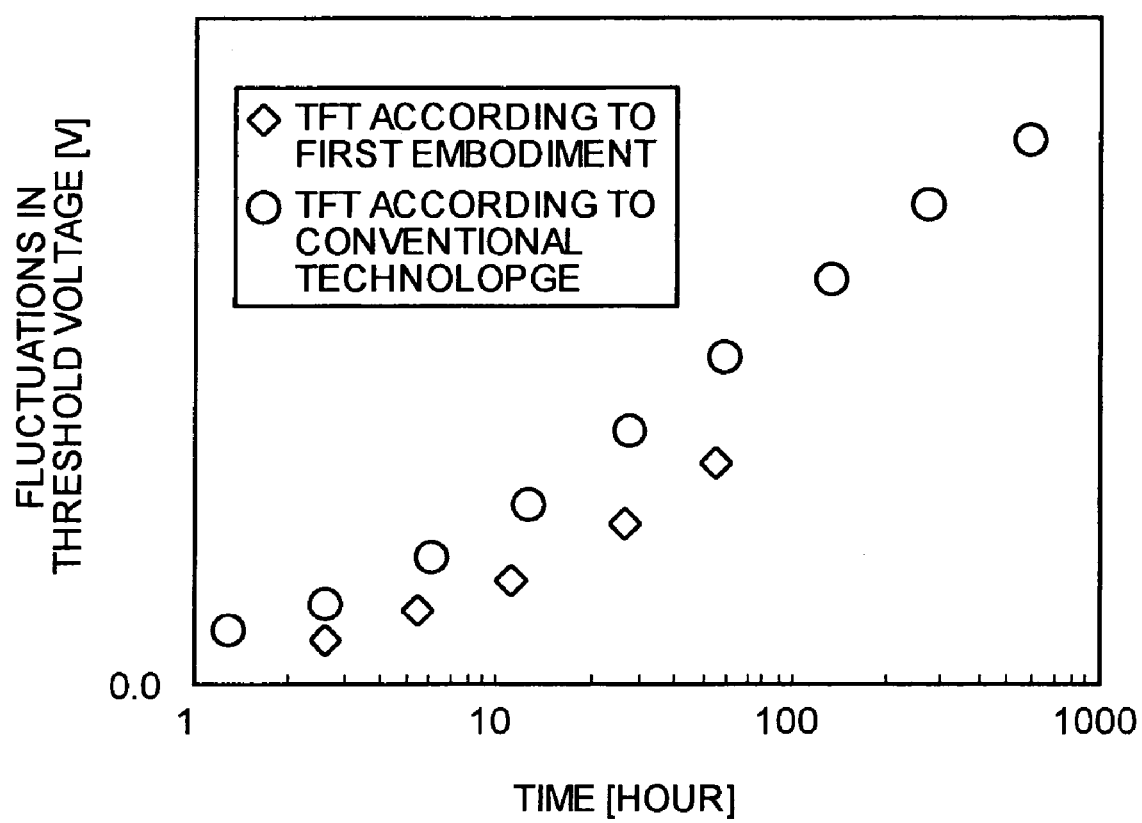
FIG. 2 is a graph of a result of measurement of fluctuations in threshold voltage of the TFT according to the first embodiment.

FIG. 2 is a graph of a result of measurement of fluctuations in threshold voltage of the TFT 1 according to the first embodiment. The measurement is conducted for the TFT 1 according to the first embodiment, as well as the TFT according to a conventional technology. In the TFT 1 according to the first embodiment, $d_1$ is made larger than $d_2$, by setting the film thickness of the semiconductor layer 5 in the region where the source region 5a and the drain region 5b are arranged to 200 nanometers, and the film thickness of the semiconductor layer 5 in the region above the gate electrode 3 to 100 nanometers. On the other hand, in the conventional TFT, the film thickness of the semiconductor layer is 50 nanometers, regardless of the region, and $d_1$ and $d_2$ are equal. This measurement is performed for measuring the fluctuations in the threshold voltage by maintaining the state that a voltage of 10 volts is applied to the gate electrode 3 and the drain electrode 6b for predetermined time.

As shown in FIG. 2, the fluctuation in the threshold voltage of the TFT 1 according to the first embodiment is smaller than that of the conventional TFT, in the whole measurement time. Therefore, the TFT 1 according to the first embodiment can suppress fluctuations in the current flowing through the TFT, as compared with the conventional TFT, even when the TFT is operated for long time.

The reason of reduction in the fluctuations in the threshold voltage in the TFT according to the first embodiment will be described below. Such a phenomenon that electrons affected by the electric field generated between the gate electrode 3 and the source electrode 6a jump across the interface between the gate insulating film 4 and the semiconductor layer 5 and enter into the gate insulating film 4 may occur in the TFT. Though not clear at present, it can be considered that this phenomenon affects the fluctuations in the threshold voltage. It is presumed that electrons entering into the gate insulating film 4 have negative fixed charge, and accompanying this, the threshold voltage fluctuates in the positive direction. It is considered that the field strength between the gate electrode 3 and the source electrode 6a is inversely proportional to the distance between the gate electrode 3 and the source electrode 6a.

Here, since $d_1$ is larger than $d_2$ in the configuration of the TFT 1 according to the first embodiment, the distance between the gate electrode 3 and the source electrode 6a becomes larger than that of the conventional TFT. Therefore, it can be considered that the field strength between the gate electrode 3 and the source electrode 6a becomes weak in the TFT 1, and the influence of electric field with respect to the electrons is reduced, thereby enabling suppression of fluctuations in the threshold voltage.

When operating in the saturated region, the TFT according to the first embodiment can suppress fluctuations in the threshold voltage. The reason thereof will be explained below. Here, when the voltage applied to the drain electrode, that is, the drain voltage is relatively low, the moving speed of electrons in the n-channel increases, in proportion to the field strength, and as a result, the drain current increases linearly, according to the drain voltage. This operation region is referred to as a linear region. When the drain voltage is gradually increased, the drain current does not increase and is saturated, even when the drain voltage is high. This region is referred to as a saturated region.

Figure 3A:
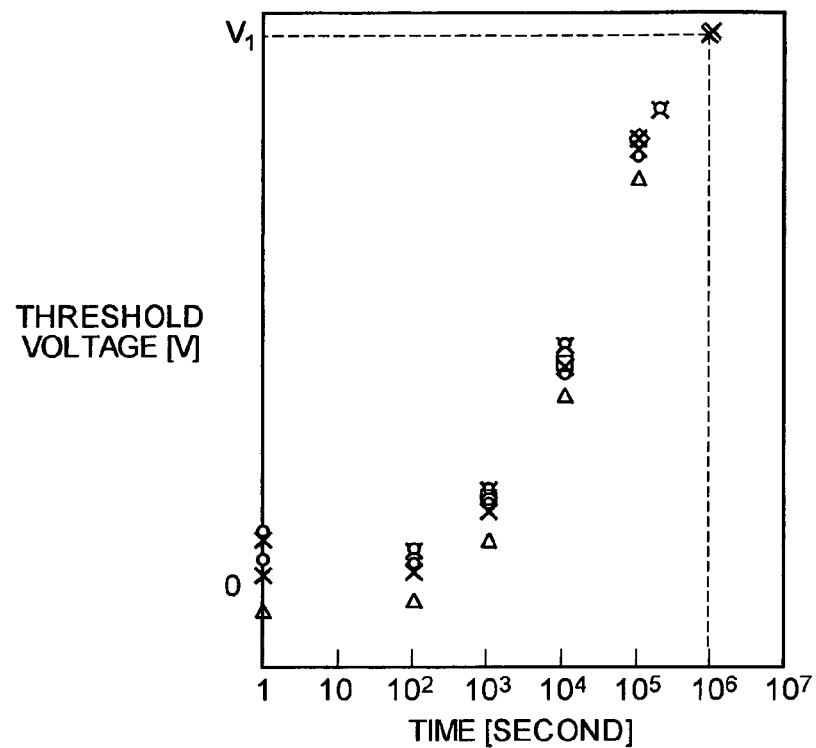
FIG. 3A is a graph of a result of measurement of fluctuations in the threshold voltage when the TFT according to the first embodiment operates in a linear region.
Figure 3B:
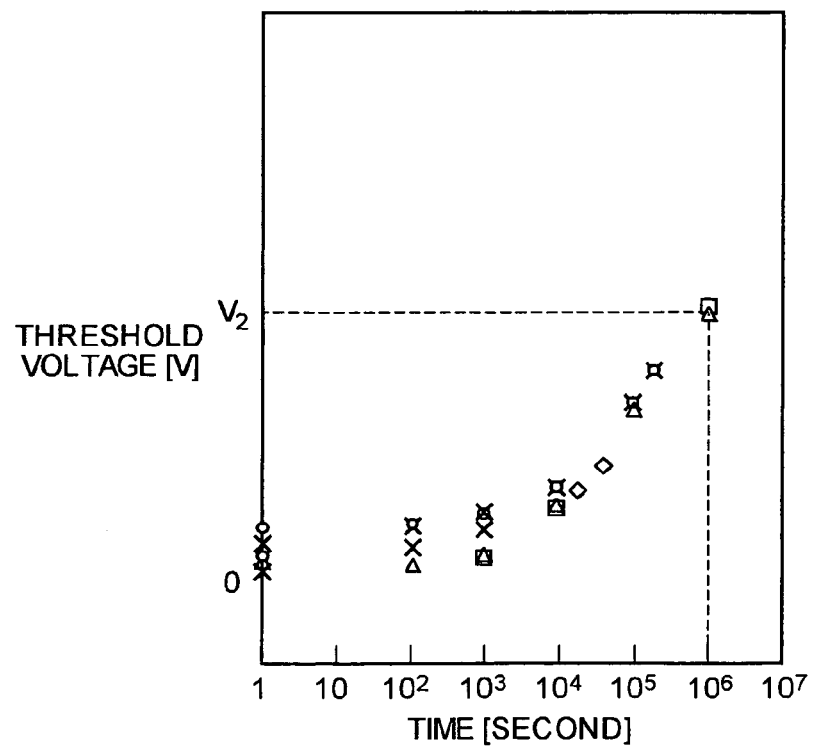
FIG. 3B is a graph of a result of measurement of fluctuations in the threshold voltage when the TFT according to the first embodiment operates in a saturated region.

FIG. 3A is a graph of a result of measurement of fluctuations in the threshold voltage when the TFT according to the first embodiment operates in a linear region; and FIG. 3B is a graph of a result of measurement of fluctuations in the threshold voltage when the TFT according to the first embodiment operates in a saturated region. The measurement is performed for a plurality of TFTs manufactured under the same condition.

As shown in FIG. 3A, when the TFT 1 operates in the linear region for $10^6$ seconds, the threshold voltage fluctuates to $V_1$. On the other hand, as shown in FIG. 3B, when the TFT 1 operates in the saturated region for $10^6$ seconds, the threshold voltage only fluctuates to $V_2$ ($<V_1$). Therefore, in the TFT 1, fluctuations in the threshold voltage are reduced when the TFT 1 operates in the saturated region, than when it operates in the linear region. Therefore, when it is assumed that a point in time when the threshold voltage fluctuates by a certain value is the end of the life span of the TFT, the life span of the TFT according to the first embodiment can be further extended by operating in the saturated region.

The reason for further suppression in fluctuations in the threshold voltage by operating the TFT according to the first embodiment in the saturated region can be presumed as follows. It is presumed that the phenomenon in which the electrons supplied from the source region enter into the gate insulating film 4 is affected by the magnitude correlation between the gate-source voltage and the source to drain voltage. In the saturated region, since the voltage applied to the source electrode is lower than that applied to the drain electrode and the gate electrode, and the voltage applied to the drain electrode is high, the difference between the source to drain voltage and the gate-source voltage is reduced. Therefore, it is construed that the rate of electrons that do not enter into the gate insulating film 4 and pass through the channel to move to the drain electrode becomes high. Therefore, it is presumed that the TFT according to the first embodiment can further suppress the fluctuations in the threshold voltage by operating in the saturated region.

The TFT according to the first embodiment can suppress the fluctuations in, the threshold voltage by operating in the saturated region, even when it is used in the ON state continuously. Therefore, even when being used continuously, the TFT according to the first embodiment can reduce a decrease in the current flowing through the TFT, and hence can be used for a longer period of time than the conventional TFT.

Figure 4:
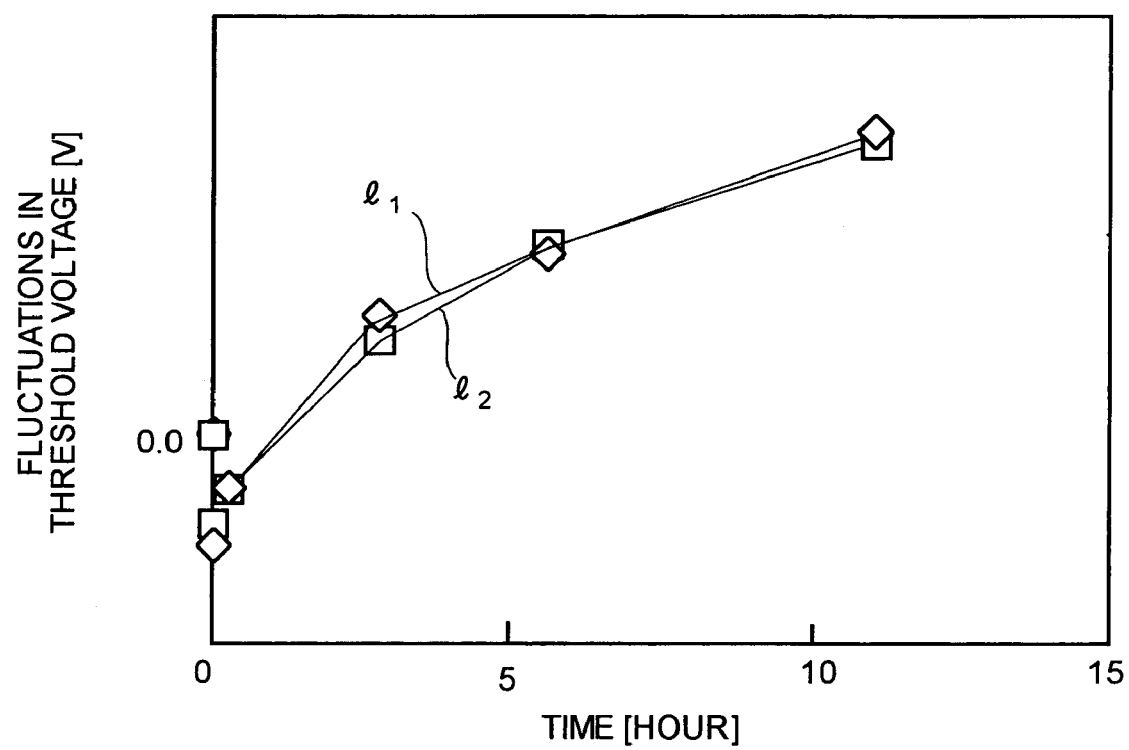
FIG. 4 is a graph of fluctuation characteristics of the threshold voltage of TFTs having different channel length in the TFT according to the first embodiment.

In the TFT according to the first embodiment, the channel length can be made short. FIG. 4 is a graph of fluctuation characteristics of the threshold voltage of TFTs having different channel length in the TFT according to the first embodiment. Curve 11 indicates the fluctuation characteristic of the threshold voltage of the TFT having a channel length of 4.5 micrometers, and curve 12 indicates the fluctuation characteristic of the threshold voltage of the TFT having a channel length of 6.5 micrometers. As shown in FIG. 4, there is not much difference between the curve 11 and the curve 12, and hence it is considered that the difference in the channel length does not affect fluctuations in the threshold voltage. Therefore, the channel can be made short in the TFT according to the first embodiment, thereby realizing miniaturization of the TFT.

As the TFT according to the first embodiment, a TFT in which the film thickness of the semiconductor layer 5 in the region where the source region 5a and the drain region 5b are arranged is set to 200 nanometers, and the film thickness of the semiconductor layer 5 in the region above the gate electrode 3 is set to 100 nanometers is explained. However, in the film thickness of the semiconductor layer 5, a difference of about 15% occurs, and specifically, the film thickness of the semiconductor layer 5 in the region where the source region 5a and the drain region 5b are arranged becomes from 170 to 230 nanometers inclusive. Further, the film thickness of the semiconductor layer 5 in the region above the gate electrode 3 becomes from 85 to 115 nanometers inclusive. The film thickness of the semiconductor layer 5 in the respective regions is not limited thereto. If the film thickness of the semiconductor layer 5 in the region where the source region 5a and the drain region 5b are arranged is a thickness in which impurities diffuse sufficiently, it is enough, and can be made thinner or thicker with respect to 200 nanometers, so long as it satisfies this condition. It is necessary to suppress the film thickness of the semiconductor layer 5 in the region above the gate electrode 3 to a thickness in which leakage does not occur between the source region 5a and the drain region 5b. On the other hand, it is necessary to increase $d_1$ in order to weaken the field strength between the gate electrode 3 and the source electrode 6a. Therefore, the semiconductor layer 5 in the TFT according to the first embodiment has a stepped configuration in the region above the gate electrode 3, and the region where the source region 5a and the drain region 5b are arranged. The film thickness of the semiconductor layer 5 in the region above the gate electrode 3 may be set to, for example, 50 nanometers, as a thickness satisfying the condition that a leakage does not occur between the source region 5a and the drain region 5b.

As the TFT according to the first embodiment, the TFT 1 in which the gate insulating film 4 and the semiconductor layer 5 are provided between the gate electrode 3 and the source electrode 6a and between the gate electrode 3 and the drain electrode 6b, is explained, but another layer may be further provided, so long as the configuration is such that $d_1$ is larger than $d_2$.

In the TFT according to the first embodiment, $d_1$ is made larger than $d_2$ by providing a difference in the film thickness of the semiconductor layer 5, or $d_1$ may be made larger than $d_2$ as shown in FIG. 5, by making the film thickness of the gate insulating film 14 corresponding to a region 14a and a region 14b larger than that of the gate insulating film 14 corresponding to a region 14c.

FIGS. 6A to 6D are schematics for illustrating a method of manufacturing the TFT according to the first embodiment. By adopting the method of manufacturing the TFT 1, as shown in FIGS. 6A to 6D, the manufacturing cost can be reduced.

Figure 6A:
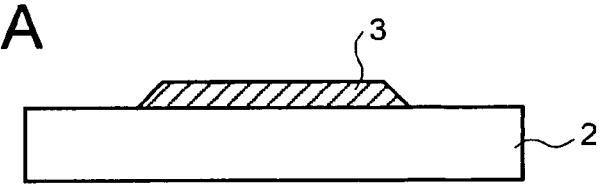
FIGS. 6A to 6D are schematics for illustrating a method of manufacturing the TFT according to the first embodiment.

FIG. 6A is a schematic of a step of forming the gate electrode 3 on the glass substrate 2. The gate electrode 3 is formed by etching using a mask pattern having a predetermined opening. A case of using a taper etching method is depicted, in which the cross section becomes trapezoidal, but an etching method in which the cross section becomes rectangular may be used.

Figure 6B:
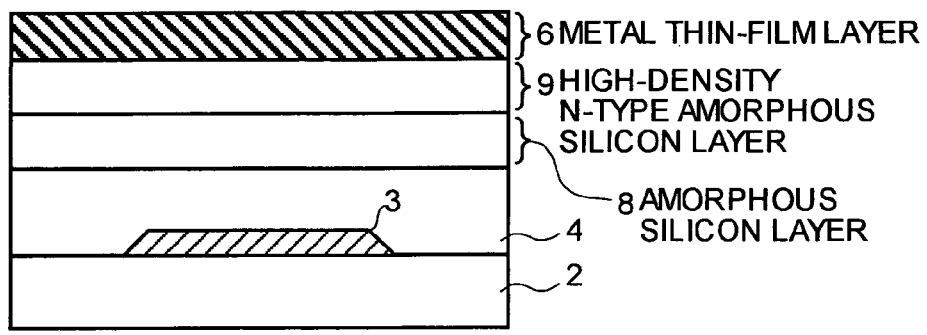

FIG. 6B is a schematic of a step of forming the gate insulating film 4, an amorphous silicon layer 8, a high-density n-type amorphous silicon layer 9, and a metal thin film layer 6 on the gate electrode 3. The amorphous silicon layer 8 is for forming the channel forming region 5c, and the high-density n-type amorphous silicon layer 9 is for forming the source region 5a and the drain region 5b at the subsequent step. The metal thin film layer 6 is for forming the source electrode 6a and the drain electrode 6b at the subsequent step.

Figure 6C:
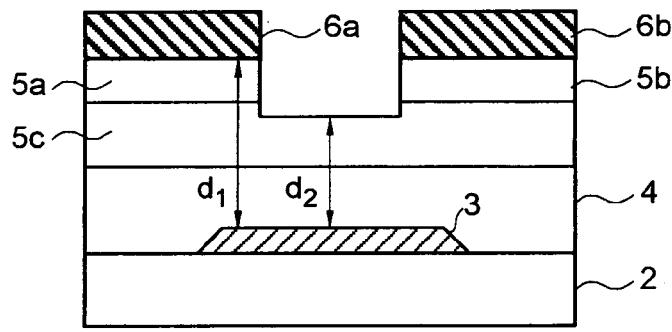
Figure 6D:
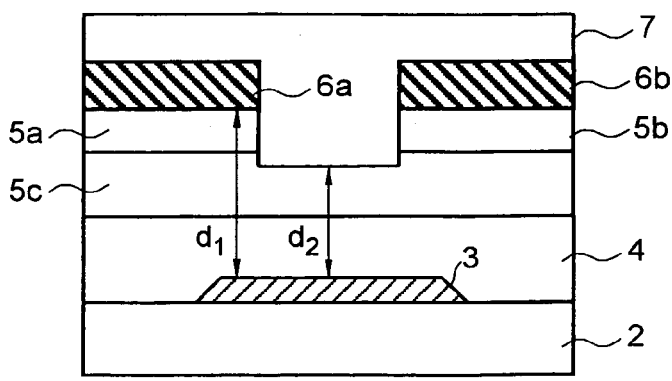

FIG. 6C is a schematic of a step of forming the source electrode 6a and the drain electrode 6b by the etching process. At this step, the metal thin film layer 6 in the region other than the region corresponding to the source electrode 6a and the drain region 6b, and the high-density n-type amorphous silicon layer 9 in the region other than the region corresponding to the source region 5a and the drain region 5b are removed. By setting a large etching quantity, a part of the amorphous silicon layer 8 in the region above the gate electrode 3 is also removed. After the etching step in FIG. 6C, the protective film 7 is formed as shown in FIG. 6D.

According to the method explained above, the TFT according to the first embodiment can be produced. Removal of the metal thin film layer 6 and the high-density n-type amorphous silicon layer 9, and reduction in film thickness of the amorphous silicon layer 8 in the region above the gate electrode 3 become possible only by one etching process, thereby enabling reduction in the production cost.

The image display apparatus according to a second embodiment will be explained next. The image display apparatus according to the second embodiment uses the TFT according to the first embodiment as the driver element, and includes a light emitting element in which the value of the current flowing therethrough is controlled by the driver-element.

Figure 7:
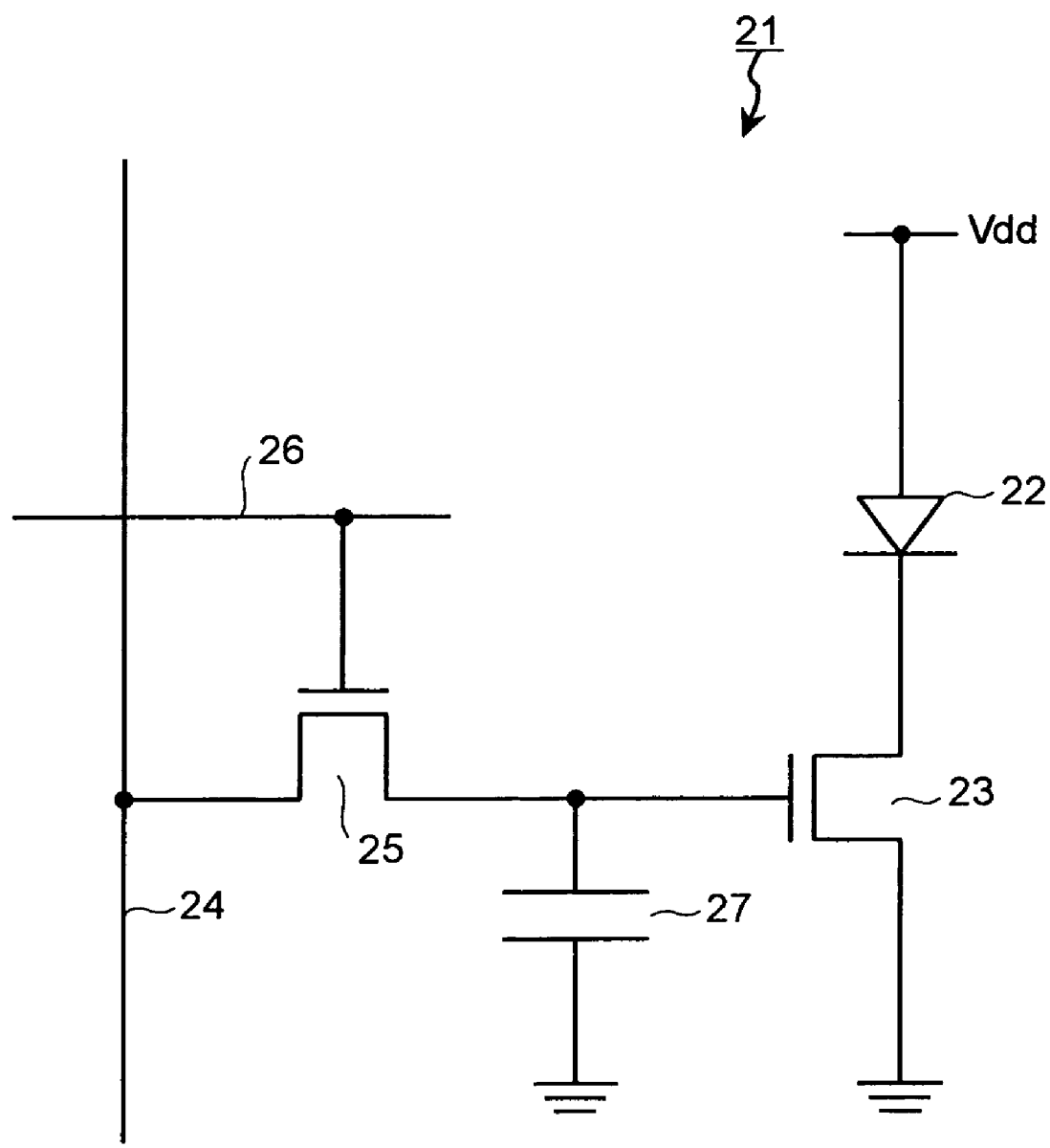
FIG. 7 is a circuit diagram of a pixel circuit according to a second embodiment of the present invention.

FIG. 7 is a circuit diagram of a pixel circuit according to a second embodiment of the present invention. The image display apparatus according to the second embodiment is formed by arranging a pixel circuit 21 in a matrix. The pixel circuit 21 includes an organic LED 22 being a light emitting element, a TFT 23 being a driver element, a data line 24 for supplying brightness data to the pixel circuit in the form of voltage, and a TFT 25 being a switching element. The pixel circuit 21 further includes a capacitor 27 that holds the voltage supplied from the data line 24, and a scan line 26 that controls the driven state of the TFT 25.

The organic LED 22 functions as the light emitting element, and emits light with brightness corresponding to the magnitude of the current flowing therethrough. The organic LED 22 is connected to one of the source and drain electrodes of the TFT 23 on one side, and to a constant power line Vdd on the other side.

The TFT 23 functions as the driver element, and controls light emission of the organic LED 22 and the intensity at the time of light emission, by controlling the current flowing through the organic LED 22. The TFT 23 and the organic LED 22 are connected in series, and when the current flows through the TFT 23, the current equal to the current flowing through the TFT 23 flows in the organic LED 22.

The source electrode of the TFT 23 is connected to the ground, and the drain electrode thereof is connected to the constant power line Vdd via the organic LED 22. Sufficiently high voltage is supplied to the drain electrode of the TFT 23 by the constant power line Vdd, and the TFT 23 regulates the value of the current flowing through the channel by the voltage supplied to the gate electrode. Therefore, the TFT 23 becomes the ON state in the saturated region. The TFT 23 has the configuration described in the first embodiment, and has a characteristic such that even when the ON state is maintained for long time in the saturated region, fluctuations in the threshold voltage are reduced, thereby reducing a decrease in the value of the current flowing in the channel.

The TFT 25 functions as the switching element, and controls supply of voltage from the data line 24 to the gate electrode of the TFT 23. When being in the ON state, the TFT 25 conducts electricity between the data line 24 and the gate electrode of the TFT 23. As a result, the data line 24 can supply predetermined voltage to the gate electrode of the TFT 23. Further, the scan line 26 controls the driven state of the TFT 25, and by setting the scan line 26 to the high level, the TFT 25 becomes the ON state, and by setting the scan line 26 to the low level, the TFT 25 becomes the OFF state.

The operation of the pixel circuit 21 until the organic LED 22 emits light will be explained below. When the scan line 26 becomes high level and the TFT 25 becomes the ON state, voltage is supplied from the data line 24 to the gate electrode of the TFT 23. When the scan line 26 is set to the low level in order to set the TFT 25 to the OFF state, the data line 24 is electrically cut off from the TFT 23, but the voltage at the gate electrode of the TFT 23 is held stably by the capacitor 27. The current flowing through the TFT 23 and the organic LED 22 has a value corresponding to the gate-source voltage of the TFT 23, and the organic LED 22 emits light with brightness corresponding to the current value.

Figure 8A:
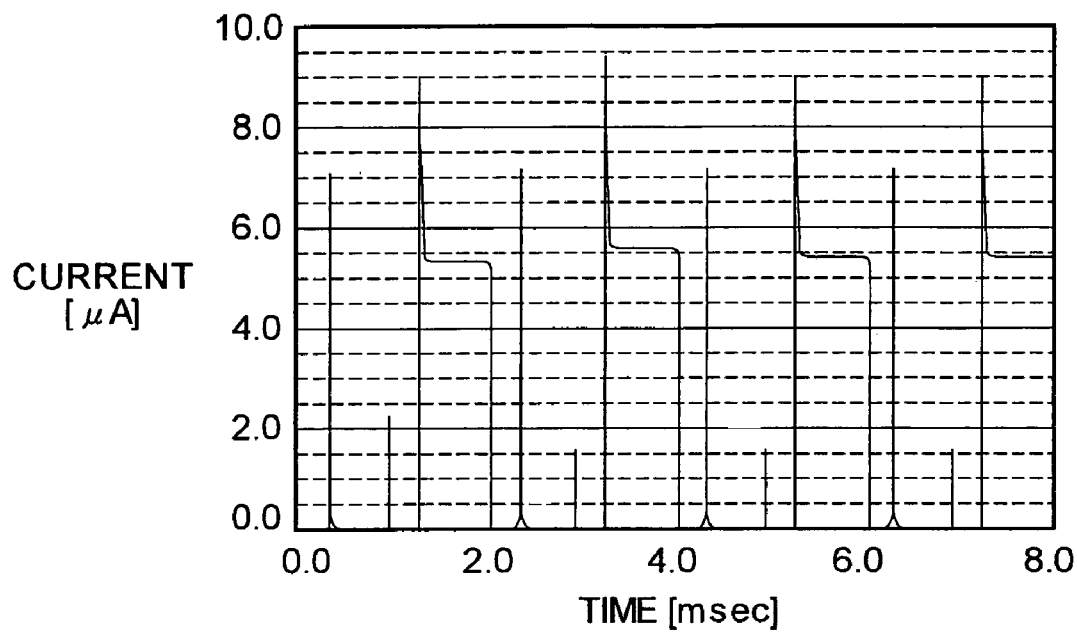
FIGS. 8A and 8B are graphs of the current flowing through an organic LED according to the second embodiment after emitting light for predetermined time.
Figure 8B:
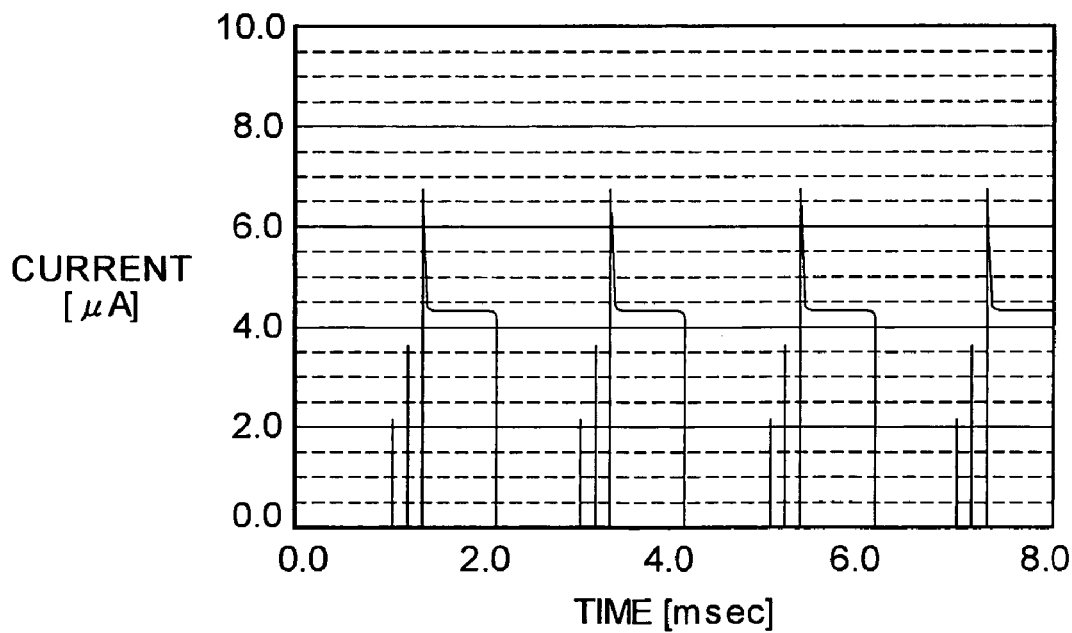
Figure 9:
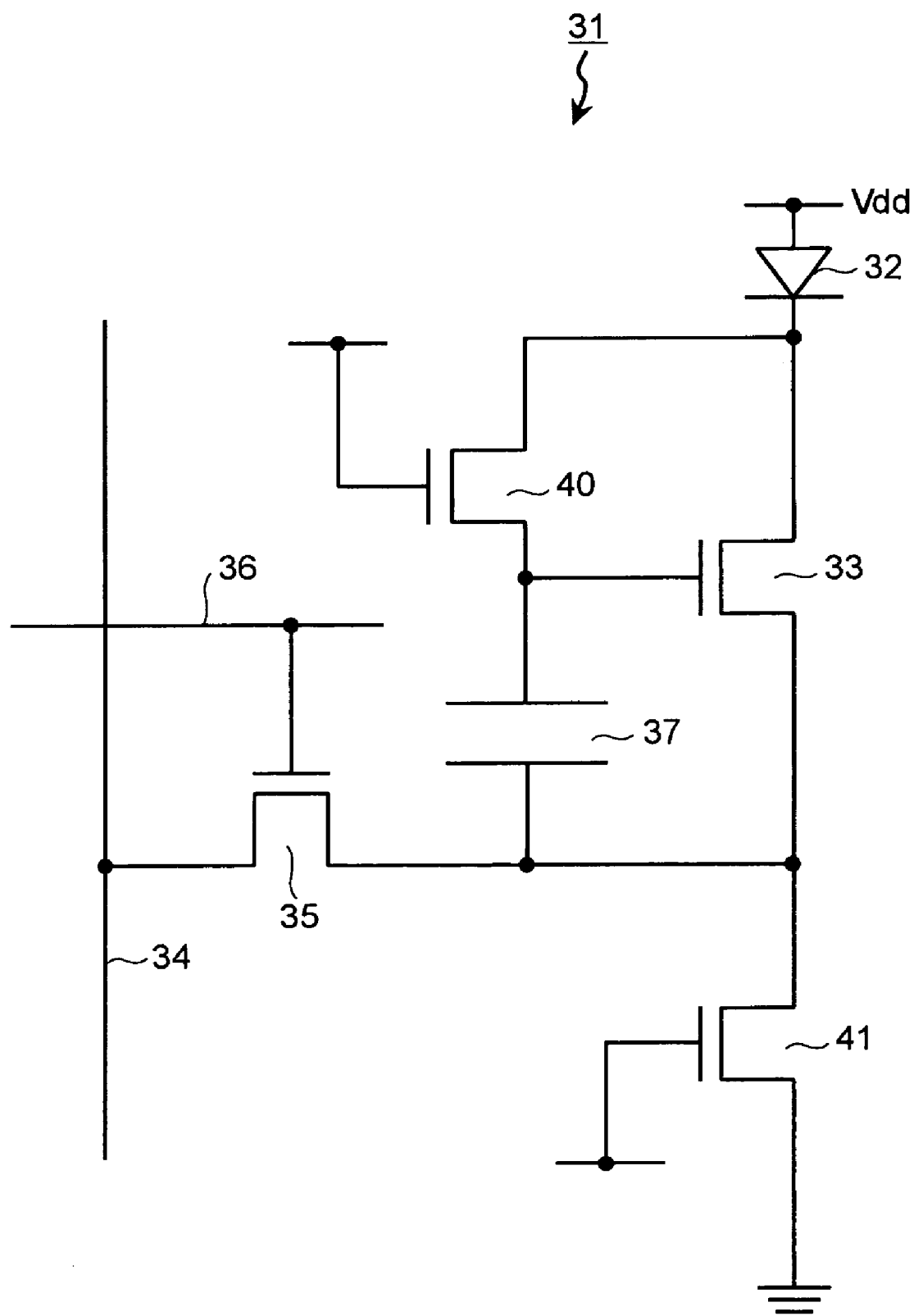
FIG. 9 is a circuit diagram of a pixel circuit according to a third embodiment of the present invention.
Figure 10:
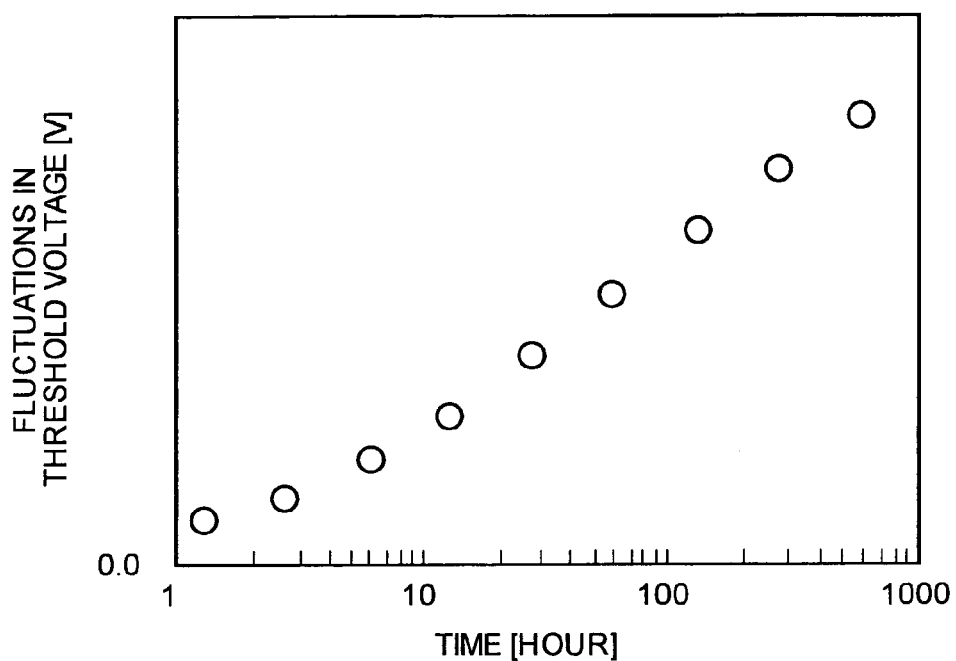
FIG. 10 is a graph of a result of measurement of fluctuations in the threshold voltage of the TFT in which amorphous silicon is used for a semiconductor layer.
Figure 11:
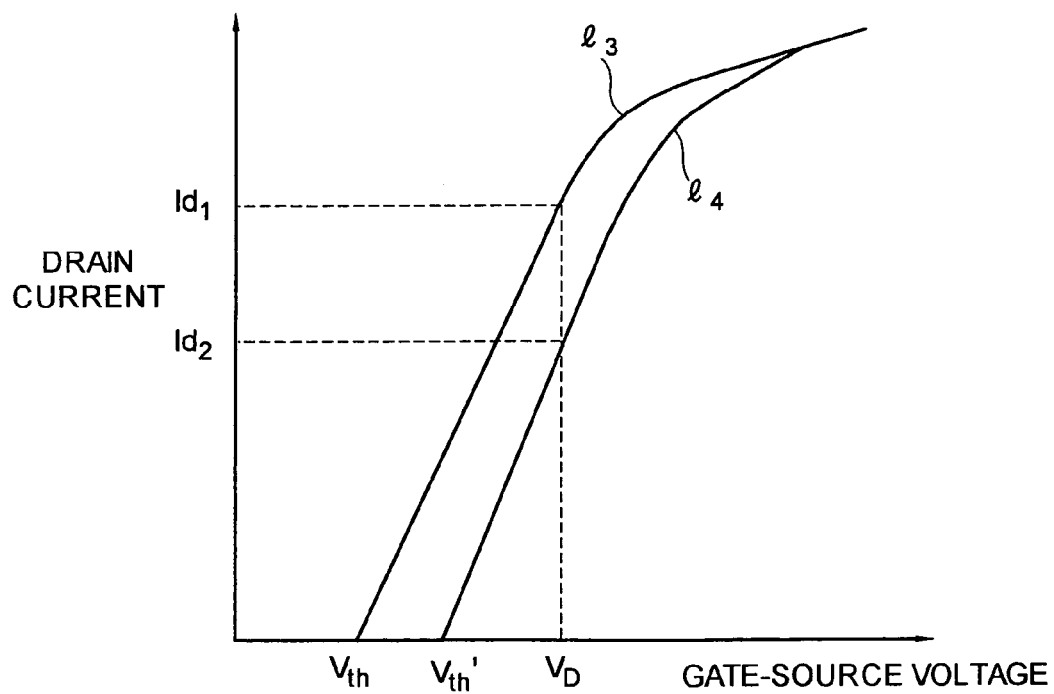
FIG. 11 is a graph of voltage-current characteristic of a TFT with the current started to flow and the TFT with the current flowed for long time.

FIGS. 8A and 8B are graphs of the current flowing through an organic LED 22 according to the second embodiment after emitting light for predetermined time. FIG. 8A depicts the value of the current flowing through the organic LED 22 for each frame, when the organic LED 22 included in the pixel circuit 21 starts to emit light, and FIG. 8B depicts the value of the current flowing through the organic LED 22 for each frame, after the organic LED 22 has continuously emitted light for 30,000 hours.

As shown in FIG. 8A, at the initial stage when the organic LED 22 starts to emit light, a current of about 5.5 microamperes flows through the organic LED 22 for each frame, over about 0.8 microsecond. On the other hand, after the organic LED 22 has emitted light continuously for 30,000 hours, as shown in FIG. 8B, a current of about 4.3 microamperes flows through the organic LED 22 for each frame, over about 0.8 microsecond, which means a reduction of only about 22% of the current flowing therethrough for each frame, as compared with the initial stage of light emission. When it is assumed that the end of the life span of the image display apparatus is when the emission brightness of the organic LED 22 decreases to 50% of that of the initial stage of light emission, in the image display apparatus according to the second embodiment, even when the organic LED 22 emits light continuously for 30,000 hours, the current flowing through the organic LED 22 shows only 22% reduction, as compared with the initial stage of light emission. Therefore, it is considered that the life span of the image display apparatus according to the second embodiment can be extended as compared with the conventional image display apparatus.

The image display apparatus according to the second embodiment can reduce a decrease in the value of the current flowing through the organic LED 22, by using the TFT according to the first embodiment as the driver element, thereby enabling suppression of fluctuations in the emission brightness of the organic LED 22 for long time. Therefore, the image display apparatus according to the second embodiment can perform high-quality image display, keeping the uniformity in the display brightness over long time, thereby enabling suppression of deterioration in the image display.

The image display apparatus according to the second embodiment is explained for a case when the organic LED 22 is used as the light emitting element. However, since it is sufficient to use a light emitting element that emits light with brightness corresponding to the magnitude of the flowing current, for example, an inorganic LED or a light emitting diode can be used other than the organic LED.

In the image display apparatus according to the second embodiment, the specific configuration of the TFT 25 being the switching element is not specifically explained, but the TFT according to the first embodiment may be used also for the TFT 25. The TFT according to the first embodiment has not only the characteristic of suppressing fluctuations in the threshold voltage, but also the characteristic of the conventional TFT. Therefore, the TFT according to the first embodiment can be used not only for the one that conducts electricity continuously, but also for a voltage driver element such as the switching element.

The image display apparatus according to a third embodiment will be explained next. In the second embodiment, the TFT according to the first embodiment is used as the driver element, but in the image display apparatus according to the third embodiment, the TFT according to the first embodiment is used as a current determining element that determines the value of the current flowing through the driver element.

FIGS. 8A and 8B are graphs of the current flowing through an organic electro-luminescence according to the second embodiment after emitting light for predetermined time. The image display apparatus according to the third embodiment is formed by arranging a pixel circuit 31 in a matrix. The pixel circuit 31 includes an organic LED 32 being the light emitting element, and a TFT 33 being the driver element. Further, the pixel circuit 31 includes a data line 34 for supplying a predetermined voltage to the source electrode of a TFT 35, the TFT 35 being the current determining element, a scan line 36 that applies a predetermined voltage to the gate electrode of the TFT 35, and a capacitor 37 that converts the current flowing through the TFT 35 into voltage and holds the voltage. The pixel circuit 31 further includes a TFT 40 that controls short circuit between the gate electrode and the drain electrode of the TFT 33, and a TFT 41 that controls electrical conduction between the source electrode of the TFT 33 and the ground.

The TFT 35 has the configuration described in the first embodiment, and has characteristics of suppressing fluctuations in the threshold voltage and suppressing a decrease in the value of the current flowing through the TFT 35, even when the ON state thereof is kept in the saturated region for long time.

The TFT 35 functions as the current determining element, and determines the value of the current flowing through the TFT 33 based on the voltage applied to the gate electrode of the TFT 35, by operating in the saturated region at the time of voltage write. The value of the current flowing through the TFT 35 is a value determined corresponding to the brightness to be realized by the organic LED 32. In order to allow the current of this value to flow through the TFT 35, the scan line 36 applies the voltage corresponding to the current value to the gate electrode of the TFT 35. The current flowing through the TFT 35 is supplied as the gate-source voltage of the TFT 35, after having been converted into voltage by the capacitor 37, and becomes the voltage value when the current corresponding to the emission brightness flows through the organic LED 32.

The organic LED 32 and the TFT 23 function in the same manner as the organic LED 22 and the TFT 33 in the second embodiment. The TFT 40 has a function of detecting the threshold voltage of the TFT 33, by short-circuiting between the gate electrode and the drain electrode of the TFT 33. The TFT 41 has a function of connecting the source electrode of the TFT 33 and the ground by becoming the ON state, so as to allow the current to flow through the TFT 33.

The operation of the pixel circuit 31 until the organic LED 32 emits light will be explained. When the TFT 40 becomes the ON state to short-circuit between the gate electrode and the drain electrode of the TFT 33, the pixel circuit 31 detects the threshold voltage of the TFT 33. Thereafter, since the scan line 36 applies a predetermined voltage to the gate electrode of the TFT 35, the TFT 35 becomes the ON state in the saturated region, and allows the current of a value determined based on the applied voltage to flow. The value of the current flowing through the TFT 35 is a value corresponding to the brightness to be realized by the organic LED 32. The capacitor 37 converts the current having flowed to the TFT 35 into voltage, holds the voltage, and supplies the held voltage to the TFT 33 as the gate-source voltage.

The TFT 41 then conducts electricity to connect the source electrode of the TFT 33 and the ground. As a result, the current flows through the TFT 33 and the organic LED 32, and the organic LED 32 emits light. The current flowing through the TFT 33 and the organic LED 32 has a value corresponding to the gate-source voltage of the TFT 33, that is, the current having flowed to the TFT 35.

As described above, the TFT 35 being the current determining element determines the value of the current flowing through the TFT 33 based on the voltage applied to the gate electrode of the TFT 35. When fluctuations in the threshold voltage occur in the TFT 35, the current flowing through the TFT 33 fluctuates, thereby making the emission brightness of the organic LED 32 nonuniform. However, in the image display apparatus according to the third embodiment, the TFT according to the first embodiment is used as the current determining element, thereby suppressing fluctuations in the threshold voltage of the current determining element. Therefore, the current of a predetermined value flows to the TFT 33 without fluctuations, and hence fluctuations in the emission brightness due to the fluctuations in the current flowing through the organic LED 32 can be reduced, thereby realizing the image display apparatus that can perform high-quality image display for long time.

In the image display apparatus according to the third embodiment, the specific configuration of the TFT 40 and the TFT 41, being a TFT other than the current determining element, is not particularly explained, but the TFT according to the first embodiment may be used for the TFT 40 and the TFT 41. As in the image display apparatus according to the second embodiment, the TFT according to the first embodiment may be used as the driver element.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An active-matrix-type image display apparatus comprising:
   a plurality of pixel circuits, each pixel circuit including
   a light emitting element that emits light of brightness corresponding to a current applied;
   a driver element that is connected to the light emitting element in series to control light emission of the light emitting element, including a first thin film transistor;
   a switching element that controls a voltage to a first gate electrode of the first thin film transistor, including a second thin film transistor; and
   a second switching element arranged in each of the pixel circuits, having a third thin film transistor,
   wherein the first thin film transistor includes
      the first gate electrode arranged on a substrate;
      a first dielectric layer formed on the first gate electrode;
      a first semiconductor layer that includes a first channel region and a first impurity region on a part of the first channel region, formed on the first dielectric layer:
      a first source electrode formed on the first impurity region; and
      a first drain electrode formed on the first impurity region, arranged to be separated from the first source electrode, wherein at least one of a part of the first source electrode and a part of the first drain electrode is overlaps a part of the first pate electrode, the overlapped region being in contact with the first impurity region,
      a first distance between an upper end of the first gate electrode and an upper end of the first impurity region is longer than a second distance between an upper surface of the first gate electrode and an upper surface of the first channel forming region, and
      a first thickness of the first semiconductor layer in a region under a least one of the first source electrode and the first drain electrode is thicker than a second thickness of the first semiconductor layer in a region between the first source electrode and the first drain electrode; and
   wherein the third thin film transistor includes
      a third gate electrode arranged on the substrate, a third dielectric layer formed on the third gate electrode,
      a third semiconductor layer that includes a third channel region and a third impurity region on a part of the third channel region, formed on the third dielectric layer,
      a third source electrode formed on the third impurity region, and a third drain electrode formed on the third impurity region, arranged to be separated from the third source electrode, wherein at least one of a part of the third source electrode and a part of the third drain electrode is overlapped with a part of the third gate electrode, the overlapped region being in contact with the third impurity region;
      a fifth distance between an upper end of the third gate electrode and an upper end of the third impurity region is longer than a sixth distance between an upper surface of the third gate electrode and an upper surface of the third channel forming region; and
      a fifth thickness of the third semiconductor layer in a region under at least one of the third source electrode and the third drain electrode is thicker than a sixth thickness of the third semiconductor layer in a region between the third source electrode and the third drain electrode.

2. The active-matrix-type image display apparatus according to claim 1, wherein the third semiconductor layer is an amorphous silicon layer.

3. The active-matrix-type image display apparatus according to claim 1, wherein the fifth thickness of the third semiconductor layer is in a range of 170 nanometers and 230 nanometers, and the sixth thickness of the third semiconductor layer is in a range of 85 nanometers and 115 nanometers.

4. The active-matrix-type image display apparatus according to claim 1, wherein the third thin film transistor is set to ON in a saturated region in which current flowing between the third source electrode and the third drain electrode is saturated with substantially no change with respect to a change in voltage applied to the third drain electrode.

5. The active-matrix-type image display apparatus according to claim 1, wherein the light emitting device is an organic light emitting device.

6. The active-matrix-type image display apparatus according to claim 1, wherein each of the plurality of pixel circuits further includes a third switching element arranged in each of the pixel circuits, having a fourth thin film transistor; wherein the fourth thin film transistor includes a fourth gate electrode arranged on the substrate;

a fourth dielectric layer formed on the fourth gate electrode;

a fourth semiconductor layer that includes a fourth channel region and a fourth impurity region on a part of the fourth channel region, formed on the fourth dielectric layer;

a fourth source electrode formed on the fourth impurity region; and a fourth drain electrode formed on the fourth impurity region, arranged to be separated from the fourth source electrode, wherein at least one of a part of the fourth source electrode and a part of the fourth drain electrode is overlapped with a part of the fourth gate electrode, the overlapped region being in contact with the fourth impurity region, wherein a seventh distance between an upper end of the fourth gate electrode and an upper end of the fourth impurity region is longer than an eighth distance between an upper surface of the fourth gate electrode an upper surface of the fourth channel forming region, and wherein a seventh thickness of the fourth semiconductor layer in a region under at least one of the fourth source electrode and the fourth drain electrode is thicker than an eighth thickness of the fourth semi-conductor layer in a region between the fourth source electrode and the fourth drain electrode.

7. The active-matrix-type image display apparatus according to claim 6, wherein the fourth semiconductor layer is an amorphous silicon layer.

8. The active-matrix-type image display apparatus according to claim 6, wherein the seventh thickness of the fourth semiconductor layer is in a range of 170 nanometers and 230 nanometers, and the eighth thickness of the fourth semiconductor layer is in a range of 85 nanometers and 115 nanometers.

* * * * *